(12) United States Patent
Prentice et al.

(10) Patent No.: US 7,980,197 B2
(45) Date of Patent: Jul. 19, 2011

(54) METHOD AND APPARATUS FOR DISPENSING A VISCOUS MATERIAL ON A SUBSTRATE

(75) Inventors: Thomas C. Prentice, Westford, MA (US); Kenneth C. Crouch, N. Andover, MA (US)

(73) Assignee: Illinois Tool Works, Inc., Glenview, IL (US)

( * ) Notice: Subject to any disclaimer, the term of this patent is extended or adjusted under 35 U.S.C. 154(b) by 755 days.

(21) Appl. No.: 11/707,620

(22) Filed: Feb. 16, 2007

(65) Prior Publication Data

US 2008/0105703 A1 May 8, 2008

Related U.S. Application Data

(60) Provisional application No. 60/856,508, filed on Nov. 3, 2006.

(51) Int. Cl.
*B05C 11/00* (2006.01)
(52) U.S. Cl. ............... 118/688; 118/243; 118/263
(58) Field of Classification Search ............ 118/243, 118/263
See application file for complete search history.

(56) References Cited

U.S. PATENT DOCUMENTS

| 3,664,462 | A | * | 5/1972 | Smith, Sr. ............... 184/7.4 |
| 3,788,561 | A | | 1/1974 | Vilagi et al. |
| 3,942,687 | A | | 3/1976 | Walus et al. |
| 4,030,640 | A | | 6/1977 | Citrin et al. |
| 4,066,188 | A | | 1/1978 | Scholl et al. |
| 4,422,151 | A | * | 12/1983 | Gilson ............... 700/283 |
| 4,524,364 | A | | 6/1985 | Bain et al. |
| 4,646,676 | A | * | 3/1987 | Kidder et al. ............... 118/243 |
| 4,656,048 | A | | 4/1987 | Kudoh et al. |
| 4,711,379 | A | | 12/1987 | Price |
| 4,784,582 | A | | 11/1988 | Howseman, Jr. |
| 4,877,745 | A | | 10/1989 | Hayes et al. |
| 4,935,261 | A | | 6/1990 | Srivastava et al. |
| 4,941,428 | A | | 7/1990 | Engel |

(Continued)

FOREIGN PATENT DOCUMENTS

DE 91 11 192 U1 1/1992

(Continued)

OTHER PUBLICATIONS

International Search Report for PCT/US2010/026933 mailed May 11, 2010.

(Continued)

*Primary Examiner* — Parviz Hassanzadeh
*Assistant Examiner* — Albert Hilton
(74) *Attorney, Agent, or Firm* — Lando & Anastasi, LLP

(57) ABSTRACT

A dispenser for dispensing a volume of viscous material on a substrate includes a frame, a gantry system coupled to the frame, and a dispenser unit coupled to the gantry system. The dispenser unit includes a housing having a chamber and a piston disposed in the chamber. The piston is configured to move between a pre-dispense position and a dispense position within the chamber. The dispenser unit further includes a dispensing bore configured to receive the piston therein and a nozzle coupled to the housing. A controller is coupled to the piston to control the operation of the piston. The dispenser is constructed such that a volume of viscous material dispensed from the dispensing bore is substantially equal to the volume of the piston entering the dispensing bore when moving the piston to the dispense position. Other embodiments and methods of dispensing viscous material are further disclosed.

26 Claims, 15 Drawing Sheets

U.S. PATENT DOCUMENTS

| | | | |
|---|---|---|---|
| 5,229,016 | A | 7/1993 | Hayes et al. |
| 5,266,349 | A | 11/1993 | Bok |
| 5,320,250 | A | 6/1994 | La et al. |
| 5,364,011 | A | 11/1994 | Baker et al. |
| 5,365,034 | A | 11/1994 | Kawamura et al. |
| 5,423,661 | A | 6/1995 | Gabeler et al. |
| 5,505,777 | A | 4/1996 | Ciardella et al. |
| 5,558,504 | A | 9/1996 | Stridsberg |
| 5,711,989 | A | 1/1998 | Ciardella et al. |
| 5,747,102 | A | 5/1998 | Smith et al. |
| 5,819,983 | A | 10/1998 | White et al. |
| 5,855,323 | A | 1/1999 | Yost et al. |
| 5,868,305 | A | 2/1999 | Watts, Jr. et al. |
| 5,894,980 | A | 4/1999 | Orme-Marmarelis et al. |
| 5,894,985 | A | 4/1999 | Orme-Marmarelis et al. |
| 5,913,455 | A | 6/1999 | La et al. |
| 5,924,975 | A * | 7/1999 | Goldowsky .................. 600/16 |
| 5,938,102 | A | 8/1999 | Muntz et al. |
| 6,010,740 | A * | 1/2000 | Rutledge et al. .................. 427/8 |
| 6,092,691 | A | 7/2000 | Schuerholz et al. |
| 6,093,251 | A | 7/2000 | Carr et al. |
| 6,186,192 | B1 | 2/2001 | Orme-Marmarelis et al. |
| 6,253,957 | B1 | 7/2001 | Messerly et al. |
| 6,261,367 | B1 | 7/2001 | Donges |
| 6,264,090 | B1 | 7/2001 | Muntz et al. |
| 6,270,019 | B1 | 8/2001 | Reighard |
| 6,276,589 | B1 | 8/2001 | Watts, Jr. et al. |
| 6,450,416 | B1 | 9/2002 | Berg et al. |
| 6,514,569 | B1 | 2/2003 | Crouch |
| 6,554,161 | B2 * | 4/2003 | Main .............................. 222/43 |
| 6,775,879 | B2 | 8/2004 | Bibeault et al. |
| 6,814,810 | B2 | 11/2004 | Prentice et al. |
| 6,814,907 | B1 | 11/2004 | Comb |
| 6,991,825 | B2 | 1/2006 | Hui et al. |
| 7,011,382 | B2 | 3/2006 | Holm et al. |
| 7,404,861 | B2 | 7/2008 | Prentice et al. |
| 2004/0140371 | A1 | 7/2004 | Engel |
| 2004/0173633 | A1 | 9/2004 | Mimura et al. |
| 2004/0247775 | A1 | 12/2004 | Boulais et al. |
| 2005/0167519 | A1 | 8/2005 | Holm et al. |
| 2006/0093493 | A1 | 5/2006 | Maruyama et al. |
| 2006/0093742 | A1 | 5/2006 | McGlinchy et al. |
| 2006/0193969 | A1 | 8/2006 | Prentice et al. |

FOREIGN PATENT DOCUMENTS

| | | |
|---|---|---|
| DE | 197 21 265 A1 | 11/1998 |
| GB | 2 129 776 A | 5/1984 |
| WO | 90/00852 | 1/1990 |
| WO | 91/12921 | 9/1991 |

OTHER PUBLICATIONS

Japanese Unexamined Patent Application Publication No. S57-176172, Nippon Electric Corp., "Method of Manufacturing a Printed Circuit Board," pp. 1-10, Oct. 29, 1982.

David B. Wallace et al., "Application of Ink Jet Technology to Adhesive Dispensing," Technical Paper, AD87-539, 1987 Society of Manufacturing Engineers, pp. 17.

Thomas Gesang et al., "Fine-Pitch-Dispensen: Klebstoffe auf den Punkt gebracht," Adhasion Kleben und Dichten, vol. 42, No. 11, 1998, pp. 28, 30-33.

MYDATA, "Introducing the MY500—the SMT industry's first jet printer," 2006, pp. 1.

Asymtek Products, "DJ-2200 DispenseJet Pump for Selective Flux and No-Flow Underfill," pp. 2, Mar. 23, 2006.

International Search Report for PCT/US2007/078454 mailed Dec. 12, 2007.

Gesang, Thomas et al., "Fine-Pitch-Dispensen: Klebstoffe auf den Punkt gebracht", 1998, vol. 42, No. 1, pp. 28, 30-33.

* cited by examiner

METHOD AND APPARATUS FOR DISPENSING A VISCOUS MATERIAL ON A SUBSTRATE

RELATED APPLICATION

This application claims priority under 35 U.S.C. §119(e) to U.S. Provisional Application Ser. No. 60/856,508, entitled "METHOD AND APPARATUS FOR DISPENSING A VISCOUS MATERIAL ON A SUBSTRATE," filed on Nov. 3, 2006, which is herein incorporated by reference in its entirety.

BACKGROUND OF THE INVENTION

1. Field of the Invention

The invention relates generally to methods and apparatus for dispensing a viscous material on a substrate, such as a printed circuit board.

2. Discussion of Related Art

There are several types of prior art dispensing systems used for dispensing metered amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which mechanically secure components to the circuit board. Underfill materials and encapsulents are used to improve the mechanical and environmental characteristics of the assembly.

Another application is to dispense very small amounts or dots onto a circuit board. In one system capable of dispensing dots of material, a dispenser unit utilizes a rotating auger having a helical groove to force material out of a nozzle and onto a circuit board. One such system is disclosed in U.S. Pat. No. 5,819,983, entitled LIQUID DISPENSING SYSTEM WITH SEALING AUGERING SCREW AND METHOD FOR DISPENSING, which is owned by Speedline Technologies, Inc. of Franklin, Mass., the assignee of the invention.

In an operation employing an auger-type dispenser, the dispenser unit is lowered towards the surface of the circuit board prior to dispensing a dot or a line of material onto the circuit board and raised after dispensing the dot or line of material. Using this type of dispenser, small, precise quantities of material may be placed with great accuracy. The time required to lower and raise the dispenser unit in a direction normal to the circuit board, typically known as a z-axis movement, can contribute to the time required to perform dispensing operations. Specifically, with auger-type dispensers, prior to dispensing the dot or line of material, the dispenser unit is lowered so that the material touches or "wets" the circuit board. The process of wetting contributes to additional time to perform the dispensing operation.

It is also known in the field of automated dispensers to launch dots of viscous material toward the circuit board. In such a system, a minute, discrete quantity of viscous material is ejected from a nozzle with sufficient inertia to enable the material to separate from the nozzle prior to contacting the circuit board. As discussed above, with the auger-type application or other prior, traditional dispensing systems, it is necessary to wet the circuit board with the dot of material prior to releasing the dot from the nozzle. When ejecting, the dots may be deposited on the substrate without wetting as a pattern of discrete dots, or alternatively the dots may be placed sufficiently close to each other to cause them to coalesce into more or less a continuous pattern.

SUMMARY OF THE INVENTION

An aspect of the invention is directed to a dispenser for dispensing a volume of viscous material on a substrate. The dispenser comprises a frame, a gantry system coupled to the frame, and a dispenser unit coupled to the gantry system. The dispenser unit comprises a housing having a chamber and a piston disposed in the chamber. The piston is configured to move between a pre-dispense position and a dispense position within the chamber. A motor is coupled to the piston to drive the movement of the piston within the chamber. The dispenser unit further comprises a dispensing bore configured to receive the piston therein and a nozzle coupled to the housing. The nozzle has an orifice co-axial with the dispensing bore. A controller is coupled to the motor to control the operation of the motor. The dispenser is constructed such that a volume of viscous material dispensed from the dispensing bore is substantially equal to the volume of the piston entering the dispensing bore when moving the piston to the dispense position.

Embodiments of the dispenser may include the following features. The housing may include a surface formed therein, and the motor may include a connector coupled to the piston. The connector includes a surface configured to engage the surface of the housing to limit the movement of the piston to the dispense position. The surface of the housing may include compliant material. The connector may be removably coupled to the piston. The housing may comprise a barrel disposed within the chamber. The barrel may have an inner diameter sized to slidably receive the piston therein. The dispensing bore may be integrally formed with the barrel. The barrel and the piston may be selected to change a diameter of the dispensing bore. The motor may comprise a linear voice coil motor. The orifice may have a small-diameter bore in fluid communication with the dispensing bore, the small-diameter bore being smaller in diameter than the dispensing bore. The dispenser unit further may comprise an opening formed in the housing to deliver viscous material to the dispensing bore. The housing may be configured such that the delivery of viscous material to the dispensing bore is blocked by the piston as the piston moves to the dispense position. The piston may have a flat end at an end adjacent the dispensing bore. In a certain embodiment, the nozzle may comprise a head portion and a needle portion extending from the head portion. The needle portion may have a needle bore that is co-axial with the dispensing bore. A retainer may be configured to capture the head portion of the nozzle to removably secure the nozzle to the housing.

Another aspect of the invention is directed to a dispenser for dispensing a viscous material on a substrate. The dispenser comprises a frame, a gantry system coupled to the frame, and a dispenser unit coupled to the gantry system. In one embodiment, the dispenser unit comprises a housing having a chamber, a barrel disposed within the chamber, and a piston disposed in the barrel. The piston is configured to move between a pre-dispense position and a dispense position within the chamber. The dispenser unit further comprises a dispensing bore configured to receive the piston therein when moving the piston to the dispense position and a nozzle coupled to the housing. The nozzle has an orifice co-axial with the dispensing bore. A motor is coupled to the piston to drive the movement of the piston within the barrel. A controller is coupled to the motor to control the operation of the motor.

A further embodiment of the invention is directed to a dispenser for dispensing a viscous material on a substrate. The dispenser comprises a frame, a gantry system coupled to the frame, and a dispenser unit coupled to the gantry system. The dispenser unit comprises a housing having a chamber, an opening formed in the housing to deliver viscous material to the chamber, and a piston disposed in the chamber. The piston is configured to move from a charge position to a dispense position within the chamber. A motor is coupled to the piston to drive the movement of the piston between the retracted position and the extended position within the chamber. A dispensing bore is configured to receive the piston therein when moving the piston to the dispense position. A nozzle is coupled to the housing, the nozzle having an orifice co-axial with the dispensing bore. A controller is coupled to the motor to control the operation of the motor. The dispenser is constructed such that the piston is configured to move from the charge position in which viscous material may be delivered to the chamber via the opening to the dispense position in which the piston is moved toward the dispensing bore of the nozzle to block the delivery of viscous material into the dispensing bore.

Yet another aspect of the invention is directed to a method of dispensing viscous material from a dispenser of the type having a chamber, an opening to deliver viscous material to the chamber, a dispensing bore in fluid communication with the chamber, and a piston movable within the dispensing bore. The method comprises: moving the piston in a direction away from the dispensing bore; delivering viscous material to the chamber through the opening; moving the piston in a direction toward the dispensing bore; cutting off the delivery of viscous material by blocking the opening with the piston as the piston moves toward the dispensing bore; and ejecting a quantity of viscous material.

A further aspect of the invention is directed to a method of dispensing viscous material from a dispenser of the type having a chamber, a dispensing bore in fluid communication with the chamber, and a piston movable within the dispensing bore. The method comprises: moving the piston in a direction away from the dispensing bore; delivering viscous material to the chamber through the opening; moving the piston in a direction toward the dispensing bore; and ejecting a quantity of viscous material substantially equal to the volume of the piston moved into the dispensing bore.

An additional aspect of the invention is directed to a method of dispensing viscous material from a dispenser of the type having a chamber, a barrel having an elongated bore formed therein, the barrel being disposed in the chamber, a dispensing bore in fluid communication with the chamber and the elongated bore of the barrel, and a piston disposed within the elongated bore of the barrel and configured to enter the dispensing bore to dispense a quantity of viscous material. The method comprising: selecting a barrel to be disposed within the chamber; selecting a piston to be disposed within the elongated bore of the barrel; installing the barrel and the piston within the chamber; moving the piston in a direction away from the dispensing bore; delivering viscous material to the dispensing bore; moving the piston in a direction toward the dispensing bore; and ejecting a quantity of viscous material.

And finally, another aspect of the invention is directed to a dispenser for dispensing a volume of viscous material on a substrate comprising a frame, a gantry system coupled to the frame and a dispenser unit coupled to the gantry system. The dispenser unit comprises a housing having a chamber and a piston disposed in the chamber. The piston is configured to move between a pre-dispense position and a dispense position within the chamber. A motor is coupled to the piston to drive the movement of the piston within the chamber. A dispensing bore is configured to receive the piston therein. A nozzle is coupled to the housing to dispense material on the substrate. The nozzle includes a head portion and a needle portion extending from the head portion. The needle portion includes a needle bore having an inner diameter and a length substantially greater than the inner diameter. The needle bore is co-axial with the dispensing bore. A retainer is configured to capture the head portion of the nozzle to removably secure the nozzle to the housing. A controller is coupled to the motor to control the operation of the motor to perform a dispense operation of viscous material on the substrate.

BRIEF DESCRIPTION OF THE DRAWINGS

For a better understanding of the invention, reference is made to the figures which are incorporated herein by reference and in which.

DETAILED DESCRIPTION OF THE PREFERRED EMBODIMENTS

Figure 1:
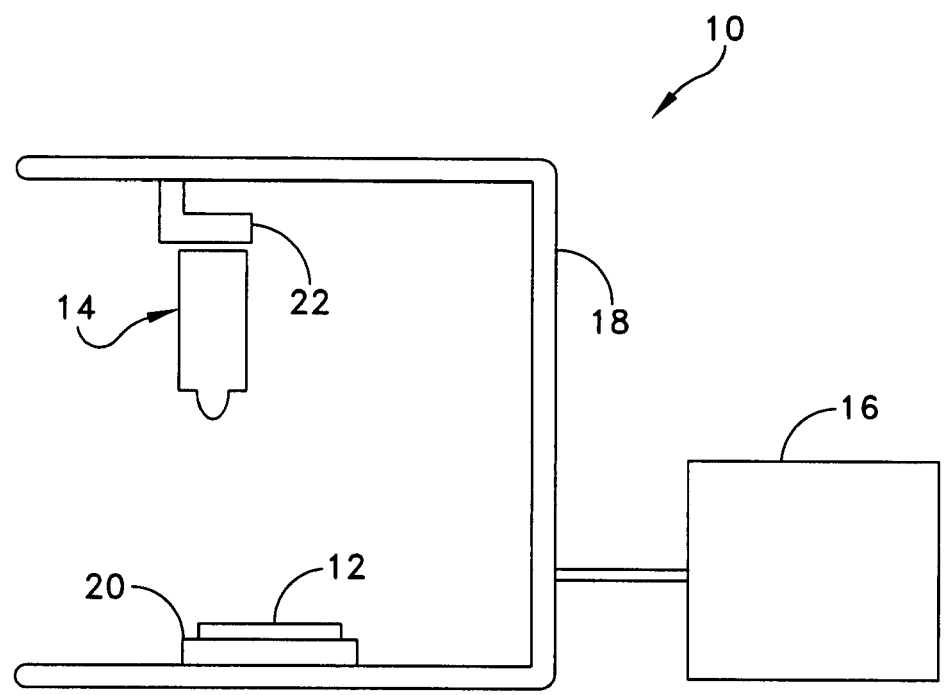
FIG. 1 is a schematic view of a dispenser used with embodiments of the invention.

For the purposes of illustration only, and not to limit the generality, the invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of the invention are directed to dispenser units, methods of dispensing and dispensing systems that contain methods and apparatus of the invention. Embodiments of the invention can be used with dispensing systems offered under the brand name CAMALOT® by Speedline Technologies, Inc. of Franklin, Mass., the assignee of the invention.

FIG. 1 illustrates a dispenser in accordance with one embodiment of the invention, generally indicated at 10, used to dispense a viscous material (e.g., adhesive, encapsulent, epoxy, solder paste, underfill material, etc.) or a semi-viscous material (e.g., soldering flux, etc.) onto a printed circuit board 12. The dispenser 10 includes a dispenser unit or head generally indicated at 14 and a controller 16. The dispenser unit may sometimes be referred to herein as a micro-piston pump unit. The dispenser 10 also includes a frame 18 having a base 20 for supporting the circuit board 12 and an arm 22 for supporting the dispenser unit 14. As is well known in the art of printed circuit board fabrication, a conveyor system (not shown) may be used in the dispenser 10 to control loading and unloading of circuit boards to and from the dispenser. The arm 22 is movably coupled to the frame 18. The arm 22 can be moved using motors under the control of the controller 16 in the x-axis, y-axis and z-axis directions to position the dispenser unit at predetermined locations, and heights, if necessary, over the circuit board 12.

In one embodiment, as discussed below, the dispenser 10 is constructed to provide needleless dispensing with a controlled volumetric flow rate for each deposit. In addition, in at least one embodiment, the dispenser unit 14 may be moved laterally across the circuit board 12, or other substrate, during dispensing. Further, in embodiments, the dispenser 10 is controlled to provide sufficient velocity to material being dispensed.

Figure 2:
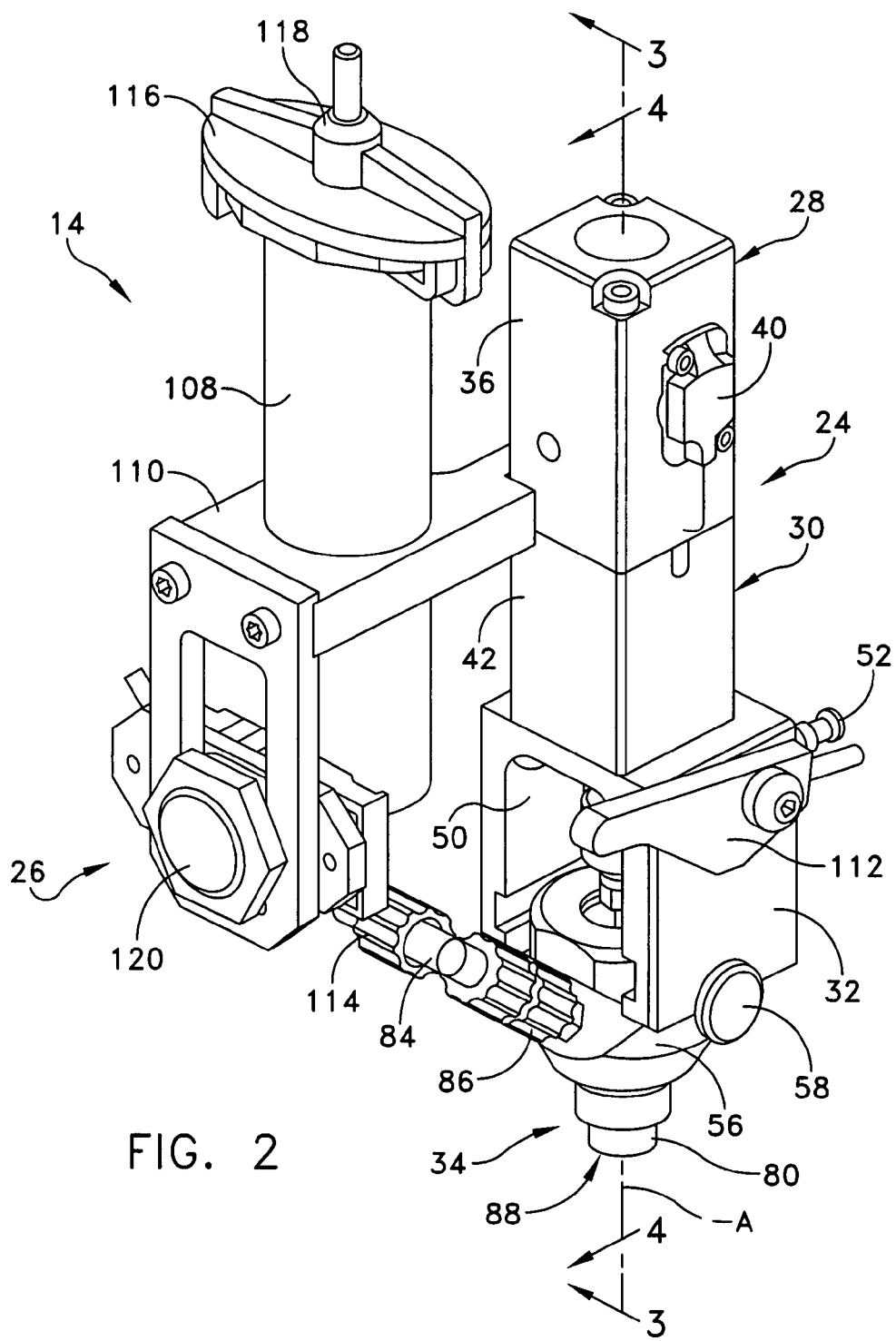
FIG. 2 is a perspective view of a dispenser unit of an embodiment of the invention.
Figure 3:
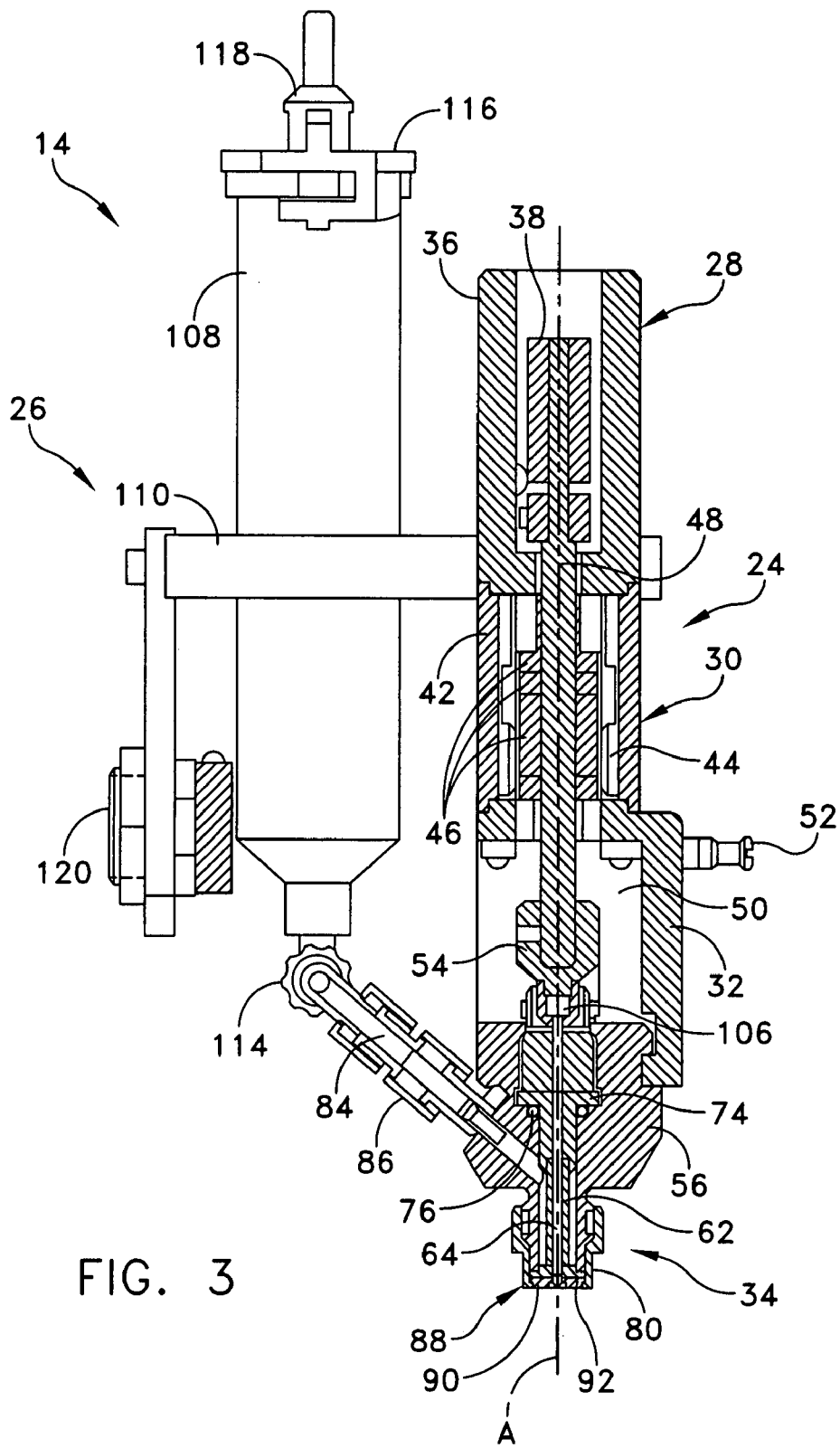
FIG. 3 is a cross-sectional view taken along line 3-3 of the dispenser unit shown in FIG. 2.
Figure 4:
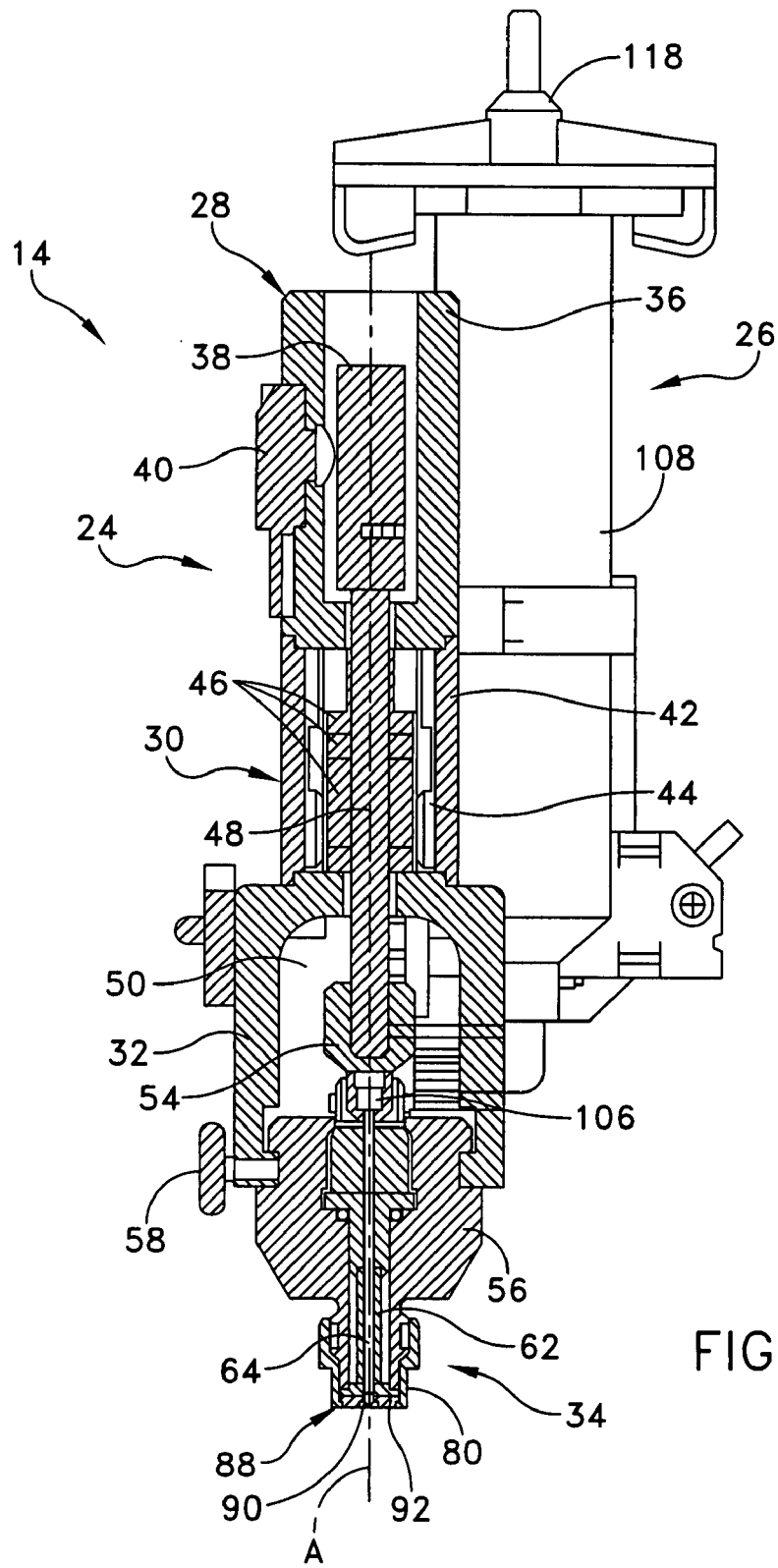
FIG. 4 is a cross-sectional view taken along line 4-4 of the dispenser unit shown in FIG. 2.

Referring now to FIG. 2, the dispenser unit 14 includes a dispensing assembly, generally indicated at 24, and a material supply assembly, generally indicated at 26, which is secured to the dispensing assembly and configured to supply viscous material to the dispensing assembly. Examples of viscous materials include, and are not limited to, solder pastes, fluxes, encapsulants, adhesives, underfills, and any other material used to mount electronic components on a printed circuit board or similar substrate. The material supply assembly 26 is designed to contain the viscous material under pressure and deliver the pressurized viscous material to the dispensing assembly 24. The dispensing assembly 24 is designed to move over the substrate (e.g., printed circuit board 12) in x- and y-directions via the arm 22 under the control of the controller 16 and to eject dots of viscous material on the substrate.

Turning now generally to FIGS. 2-8, in one embodiment, the dispensing assembly 24 may be configured to include an encoder assembly generally indicated at 28, a motor assembly generally indicated at 30, a dispenser housing 32 and a nozzle assembly generally indicated at 34. Specifically, the encoder assembly 28 includes an encoder housing 36, an encoder scale 38 and a position encoder 40. The position encoder 40 of the encoder assembly 28 communicates with the controller 16 to provided closed-loop feedback on the position of the motor assembly 30 during the operation of the dispenser 10. The provision of an encoder with a moving scale 38 reduces inertia and eliminates the need for a flexing wire typically required by a moving encoder head and stationary scale.

In one embodiment, the motor assembly 30 is a voice coil motor that is configured to communicate with the controller 16. The motor assembly 30 may comprise a motor housing 42 fabricated from a ferromagnetic material, a voice coil 44, magnets 46, and a drive shaft 48 coupled with the magnets. As shown, the encoder housing 36 and the motor housing 42 are coupled together along axis A. The provision of a moving magnet voice coil motor eliminates flexing wires of traditional voice coil motors and provides enhanced thermal connection between the voice coil 44 and the motor housing 42 to enhance heat dissipation of the motor assembly 30.

The arrangement is such that the voice coil 44 is disposed between the magnets 46 and the ferromagnetic motor housing 42 to drive the up-and-down motion of the drive shaft 48 within the dispenser assembly 26. The position encoder 40 is located to sense the position of the drive shaft 48 as the drive shaft moves up and down within the motor housing 42. The controller 16 may be configured with a driver (not shown) that communicates with the motor assembly 30 and the encoder assembly 28. This arrangement precludes commutation and minimizes magnetic cogging to yield better control of the motor.

The dispenser housing 32, which is coupled to the motor housing 42 along axis A, is configured to define a chamber 50 (see FIGS. 3-8) through which a lower end of the drive shaft 48 moves. Connected to the lower end of the drive shaft 48 is a piston drive yoke or connector 54, which projects into the chamber 50 of the dispenser housing 32. As best shown in FIG. 8, a slot (not shown) is formed in the piston drive yoke 54 to receive an alignment pin 55, which assures alignment of the drive yoke and a piston adapter. The alignment pin 55 also provides a means of assuring correct alignment of the optical position encoder scale 38, which controls the position of the piston. A more detailed explanation of the piston drive yoke 54 will be provided below as the description of the dispenser unit 14 proceeds.

In a certain embodiment, the nozzle assembly 34 may include a nozzle housing 56, which is secured to the dispenser housing 32 with a retaining screw 58. The nozzle housing 56 may be configured to include a cylindrical chamber 60 configured to receive a barrel cylinder 62 and a piston 64 having an upper end and a lower end having a flat surface 70. The piston 64 is configured to be received and slidably moved within an elongated bore 72 formed in the barrel cylinder 62 along axis A. In one embodiment, the piston 64 has a diameter between 0.020 inches to 0.062 inches, with a preferred diameter of 0.032 inches. The elongated bore 72 of the barrel cylinder 62 is sized to receive the piston 64 therein so that the piston can slide within the bore.

A seal nut 74 and suitable seals 76, 78 (FIG. 5) secure an upper portion of the barrel cylinder 62 to the nozzle housing 56 within the cylindrical chamber 60. A piece of compliant material 79 may be disposed above the seal nut 74 to provide a resilient force to cause the rapid deceleration of the piston 64 as it completes its downward stroke. This configuration enables the dispenser 10 to operate relatively quietly. A lower portion of the barrel cylinder 62 is secured by a needle nut or retainer 80 of the nozzle assembly 34, which will be described in greater detail below. The cylindrical chamber 60 defines a small dispensing cavity that is in fluid communication with a material feed tube 84, which is adapted to receive material from the material supply assembly 26. As shown, the material feed tube 84 is releasably secured to the nozzle housing 56 by an inlet fitting 86. As will be described in greater detail below, the viscous material is delivered to the cylindrical chamber 60 to the small dispensing cavity under pressure.

Figure 7:
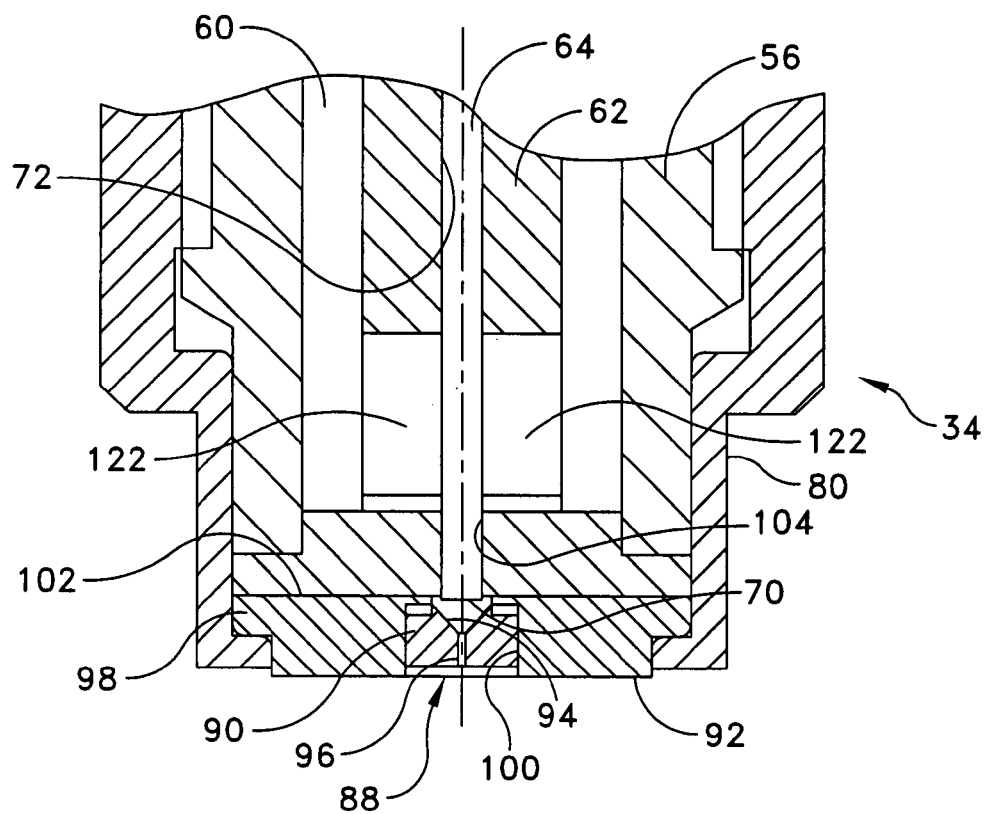
FIG. 7 is an enlarged cross-sectional view of an orifice assembly of the nozzle shown in FIG. 6.
Figure 8:
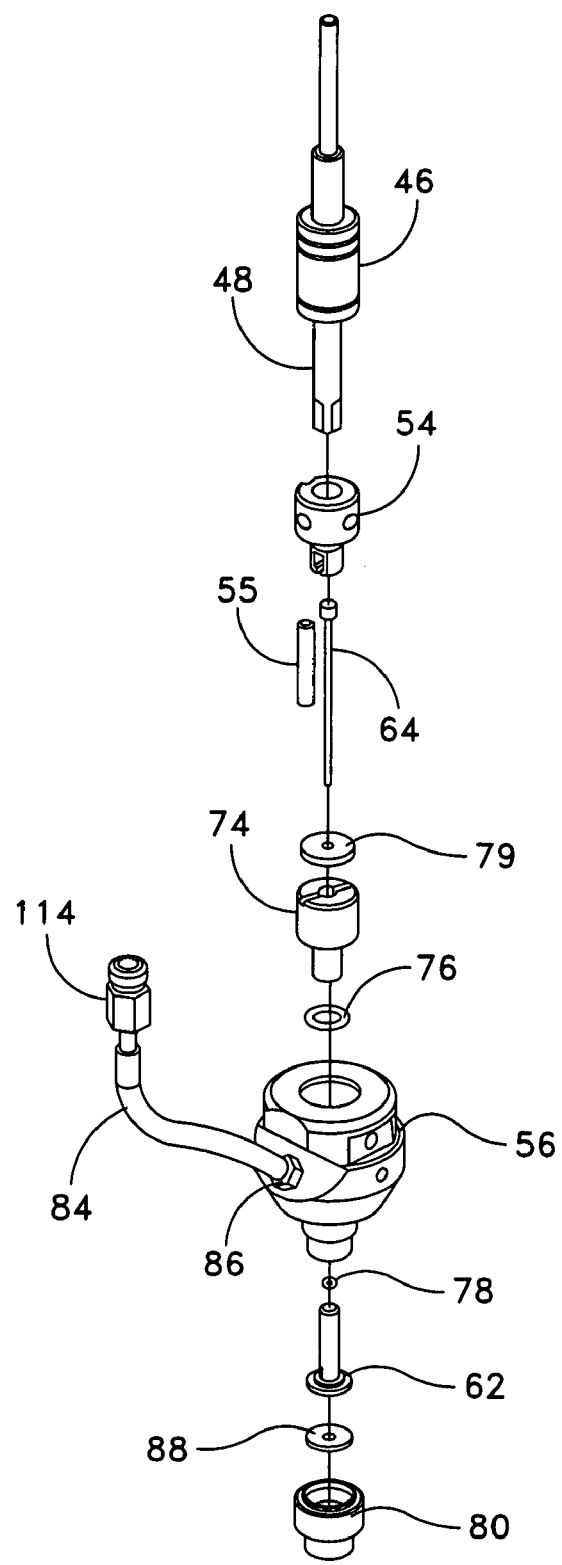
FIG. 8 is an exploded perspective view of internal components of the dispenser unit shown herein.

As best shown in FIG. 7, the nozzle assembly 34 further includes an orifice assembly, generally indicated at 88, designed to be threadably secured to the lower end of the nozzle housing 56 by the needle nut 80. Specifically, the orifice assembly 88 comprises an orifice insert 90, an orifice adapter 92 configured to receive the orifice insert, and the needle nut 80, which is configured to threadably attach the entire orifice assembly to the nozzle housing 56 by the needle nut 80. As shown, the orifice insert 90 is a generally cylindrical member having a conical surface 94 and a small-diameter bore 96, e.g., 0.005 inches in diameter, formed therein. In one embodiment, the orifice insert 90 may be fabricated from a hard material, such as synthetic sapphire.

The arrangement is such that viscous material is ejected from the small-diameter bore 96 onto a substrate, e.g., circuit board 12. The orifice adapter 92, in one embodiment, has a lower portion 98 with a recess 100 formed therein that is sized to receive the orifice insert 90. A swaged connection may be provided to secure the orifice insert 90 within the recess 100 of the lower portion 98 of the orifice adapter 92. The orifice adapter 92 communicates with a lower face 102 of the barrel cylinder 62. The barrel cylinder 62 further includes a dispensing bore 104 integrally formed therein that is in fluid communication with the cylindrical chamber 60. The dispensing bore 104 is sized to receive the lower portion of the piston 64 when performing a dispensing stroke as illustrated in FIG. 7. As shown, the small-diameter bore 96 is co-axial with the dispensing bore 104. There is no need to adjust the position of the small-diameter bore 96 since the orifice insert 90 is mechanically constrained by the orifice adapter 92 and the needle nut 80. In a particular embodiment, the nozzle assembly 34 may be provided as a complete assembly to the end user of the dispenser 10 to aid in cleaning of the nozzle assembly. Specifically, a used nozzle assembly may be completely removed from the dispenser unit 14 of the dispenser 10 by unscrewing the needle nut 80 and replaced with a new (clean) nozzle assembly.

Figure 5:
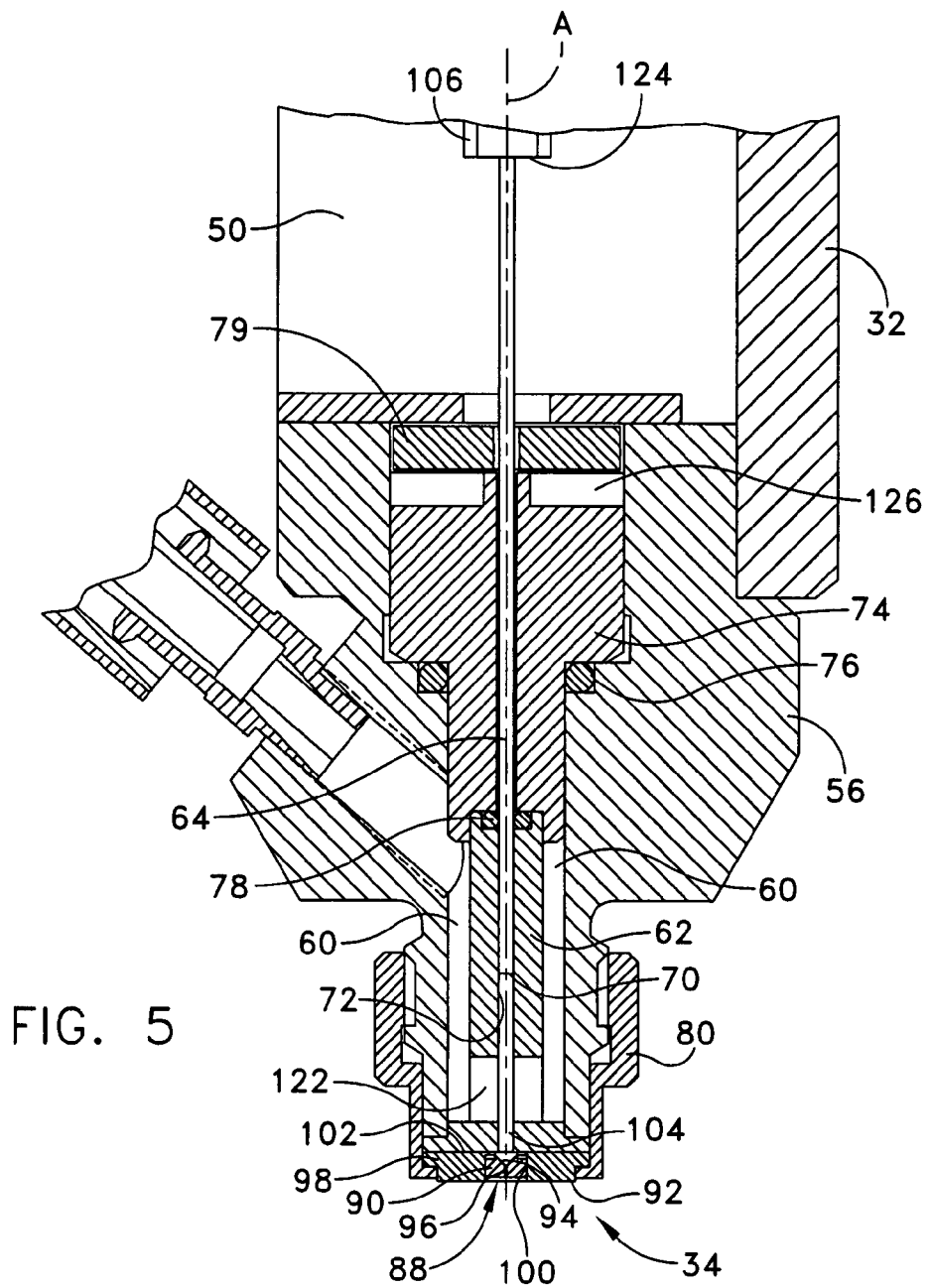
FIG. 5 is an enlarged cross-sectional view of a nozzle of the dispenser unit shown in FIG. 3 in a pre-dispense position.
Figure 6:
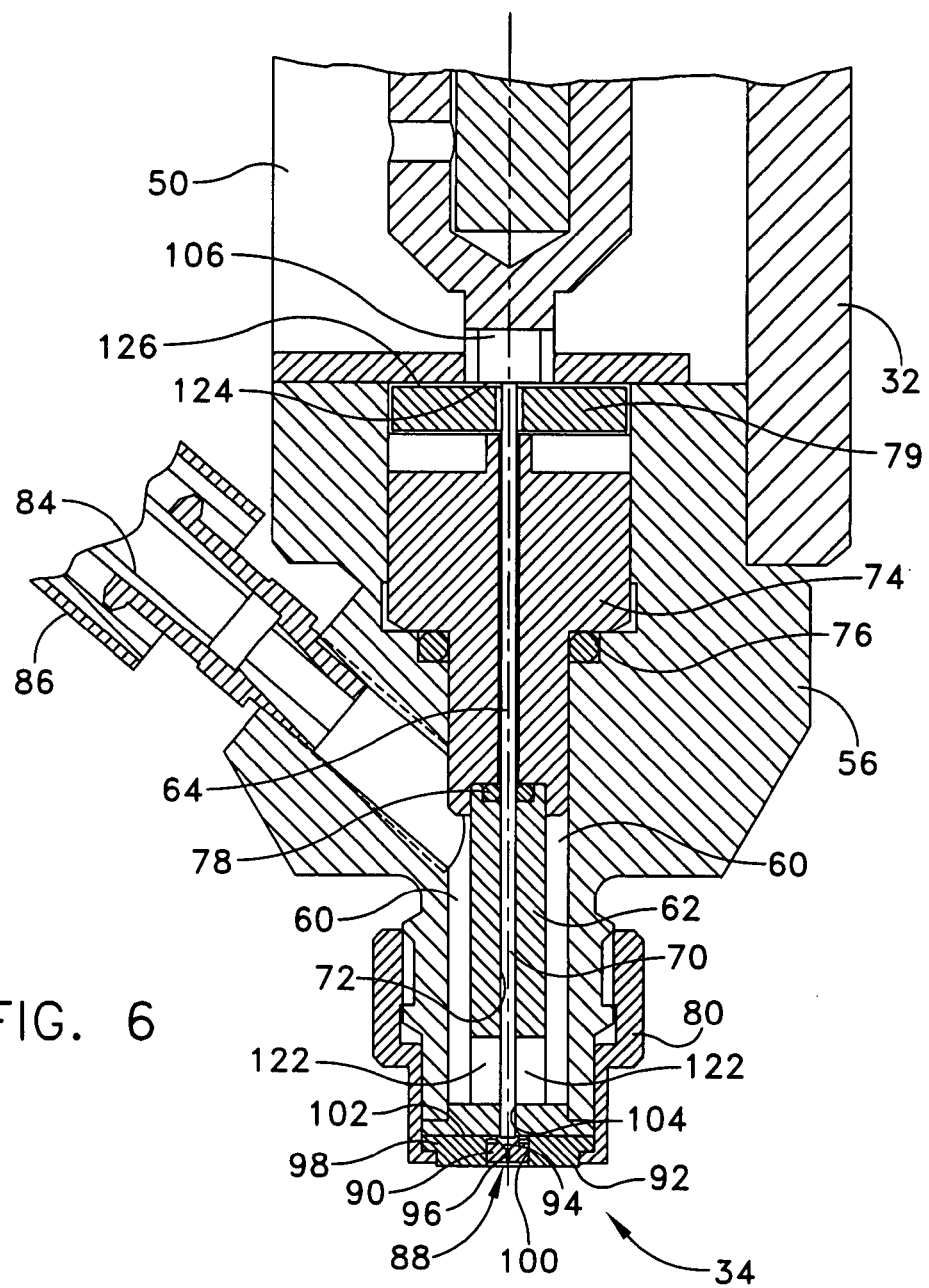
FIG. 6 is an enlarged cross-sectional view of the nozzle shown in a dispense position.

Referring back to FIGS. 3-6, and more particularly to FIGS. 3 and 4, in a certain embodiment, the upper portion of the piston 64 includes an enlarged head 106 that is captured by and secured to the piston drive yoke 54 of the motor assembly 30. Thus, the arrangement is such that the motor assembly 30 drives the up-and-down motion of the piston 64 within the chamber 50 by moving the drive shaft 48. The piston 64 is configured to reciprocally move between a retracted, pre-dispense position (FIG. 5) and an extended, dispense position (FIG. 6). The volume of viscous material dispensed by the dispenser unit 14 is substantially equal or at least related to the volume of the piston 64 entering the dispensing bore 104 (FIG. 7) as the piston travels toward the orifice insert 90. The flat end 70 of the piston 64 assists in shearing trapped fluid filler particles contained within the dispensing bore 104 when the lower portion of the piston is lowered therein, thereby closing off inlet passage 122.

In the shown embodiment, the material supply assembly 26 includes a material supply cartridge or container 108, the material feed tube 84, and a mounting assembly. As shown, the mounting assembly includes a mounting bracket 110 and a mounting lever 112. Mounting lever 112 operates a cam-lock to secure the dispenser unit 14 to the arm 22. The material feed tube 84 is connected to the cartridge 108 by an outlet fitting 114, which connects the cartridge to the nozzle housing 56 of the dispensing assembly 24 at an angle, which relies on gravity to enhance the flow of the viscous material into the chamber 50. A cap 116 is provided to close an upper end of the cartridge 108. The cap 116 is configured with an air pressure inlet 118, which supplies air under pressure to the cartridge to pressurize the viscous material contained within the cartridge. The pressurized viscous material flows from the cartridge 108 to the material feed tube 84 to the chamber 50 of the dispensing assembly 24. A material level sensor 120, which is coupled to the controller 16, may be provided to monitor the level of material contained within the cartridge 108.

Viscous material flows from the material feed tube 84 to the chamber 50 so that viscous material is deposited under pressure between an inner wall of the nozzle housing 56 that defines the cylindrical chamber 60 and an outer wall of the barrel cylinder 62. As best shown in FIGS. 5 and 6, viscous material enters the dispensing bore 104 by way of two narrow slits, each indicated at 122, formed in the barrel cylinder 62. The arrangement is such that when the piston 64 is in a retracted position, in which the motor assembly 30 raises the piston 64, viscous material enters the bore 72 formed in the barrel cylinder 62 and the dispensing bore 104. Thus, when the piston 64 is moved to an extended or dispensing position toward the orifice insert 90, in which the motor assembly 30 lowers the piston 64 via the drive shaft 48, the piston blocks the communication of viscous material between the narrow slits 122 and the dispensing bore 104 as material in the dispensing bore is dispensed. A sleeve (not shown) may be provided around the barrel cylinder 62 to selectively enlarge or reduce the size of the slits 122 to increase or decrease the amount of material entering the dispensing bore 104.

In the shown embodiment, the barrel cylinder 62, the piston 64 and the orifice insert 90 are removable and interchangeable so that the size of the dots of viscous material may be changed. For example, for larger dots, the size of the barrel cylinder 62, the piston 64, the small diameter bore 104, and dispensing bore 96 in the orifice insert 90 may be increased. Conversely, for smaller dots, these dimensions may be decreased. In addition, since the dispensing assembly 24 in general and the nozzle assembly 34 in particular are easily removable, these components, including the seals 76, 78, may be quickly and efficiently removed for cleaning and replacement.

When operating the dispenser 10, the piston 64 is moved between the retracted and extended positions to dispense dots of material from the dispensing bore 104 of the orifice adapter 92 via the small diameter bore 96 of the orifice insert 90. Specifically, and with reference to FIGS. 5 and 6, when the piston 64 is in its retracted position, viscous material enters the dispensing bore 104 from the cylindrical chamber 60 by way of slits 122. When moved to its extended position under the operation of the controller 16 via the drive shaft 48 of the motor assembly 30, the piston 64 cuts off the supply of viscous material to the dispensing bore 104 by blocking the slits 122 of the barrel cylinder 62. As discussed above, as the piston 64 enters the dispensing bore 104, the flat end 70 of the piston 64 shears trapped particles contained within the dispensing chamber within the dispensing bore 104. The arrangement is such that the volume of viscous material dispensed from the dispensing bore 104 is substantially equal to the volume of the piston entering the dispensing bore. The downward stroke of the piston 64 is limited by a shoulder portion or surface 124 of the head 106 of the piston that engages a shoulder portion or surface 126 defined by the compliant material 79 located above the seal nut 74. Thus, when dispensing a dot of material, the piston 64 enters into the dispensing bore 104 at a relatively fast rate of speed under the control of the controller 16 and the motor assembly 30 and immediately decelerates upon the engagement of the shoulder portions 124, 126 of the piston 64 and the seal nut 74 nozzle housing 56. The resilient material 79 cushions this immediate deceleration of the piston 64.

In one embodiment, to change the size of dots dispensed by the dispenser unit 14, the barrel cylinder 62, piston 64 and orifice insert 90 may be replaced. Specifically, by unscrewing the needle nut 80, the orifice insert 90 and the orifice adapter 92, which are contained within the needle nut, are also removed. Once removed, the barrel cylinder 62 may be removed from its seat within the seal nut 74. The barrel cylinder 62 may be replaced with another barrel cylinder having a bore 72 of a different diameter. The piston 64 is replaced by another piston having a diameter sized so that the piston slides within the bore 72 of the barrel cylinder 62. Additionally, the orifice insert 90 may be replaced to have a small diameter bore 96 and a dispensing bore 104 that are sized to work with the specific barrel cylinder 62 and piston 64. As mentioned above, the entire nozzle assembly 34 may be replaced with a replacement nozzle assembly to change the size of the small diameter bore of the orifice insert.

In another embodiment, the dispenser unit 14 may be configured with a heater to heat the viscous material as the material is ejected from the dispenser unit. Specifically, the heater is provided to reduce the viscosity of the material so as to better control the ejection of material from the dispenser unit. In one embodiment, the heater may be coupled to the nozzle housing 56, as by a clamping mechanism.

FIGS. 9A-9D illustrate the sequence of a dispense operation for a dispenser unit, generally indicated at 200, of an embodiment of the invention. As shown, the dispenser unit 200 is substantially identical to dispenser unit 14. Thus, corresponding parts are designated with corresponding reference numbers in FIGS. 9A-9D.

Figure 9A:
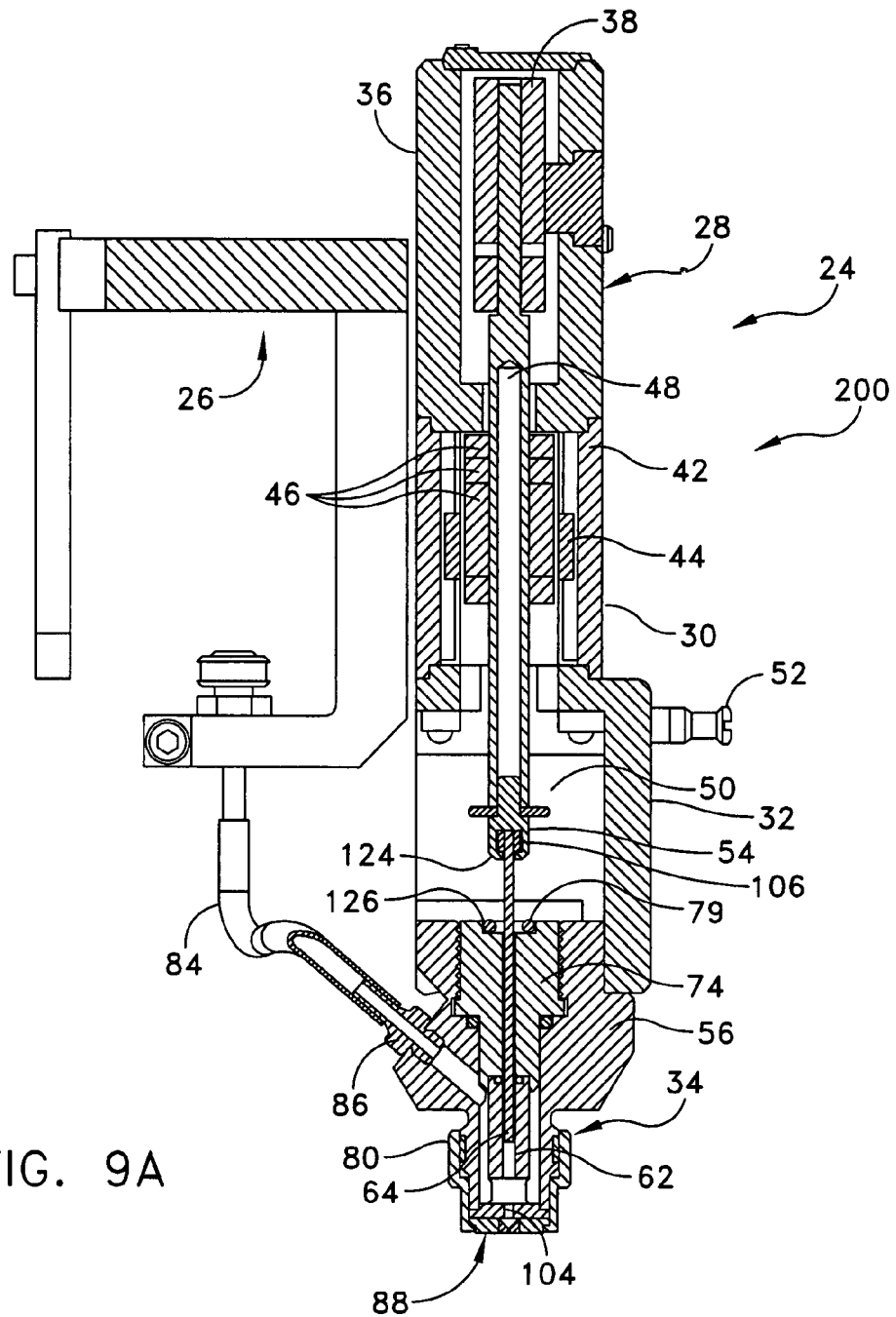
FIGS. 9A-9D are cross-sectional views of a dispenser unit of embodiments of the invention showing the dispenser unit in pre-dispense, park, dispense and charge positions, respectively.
Figure 9B:
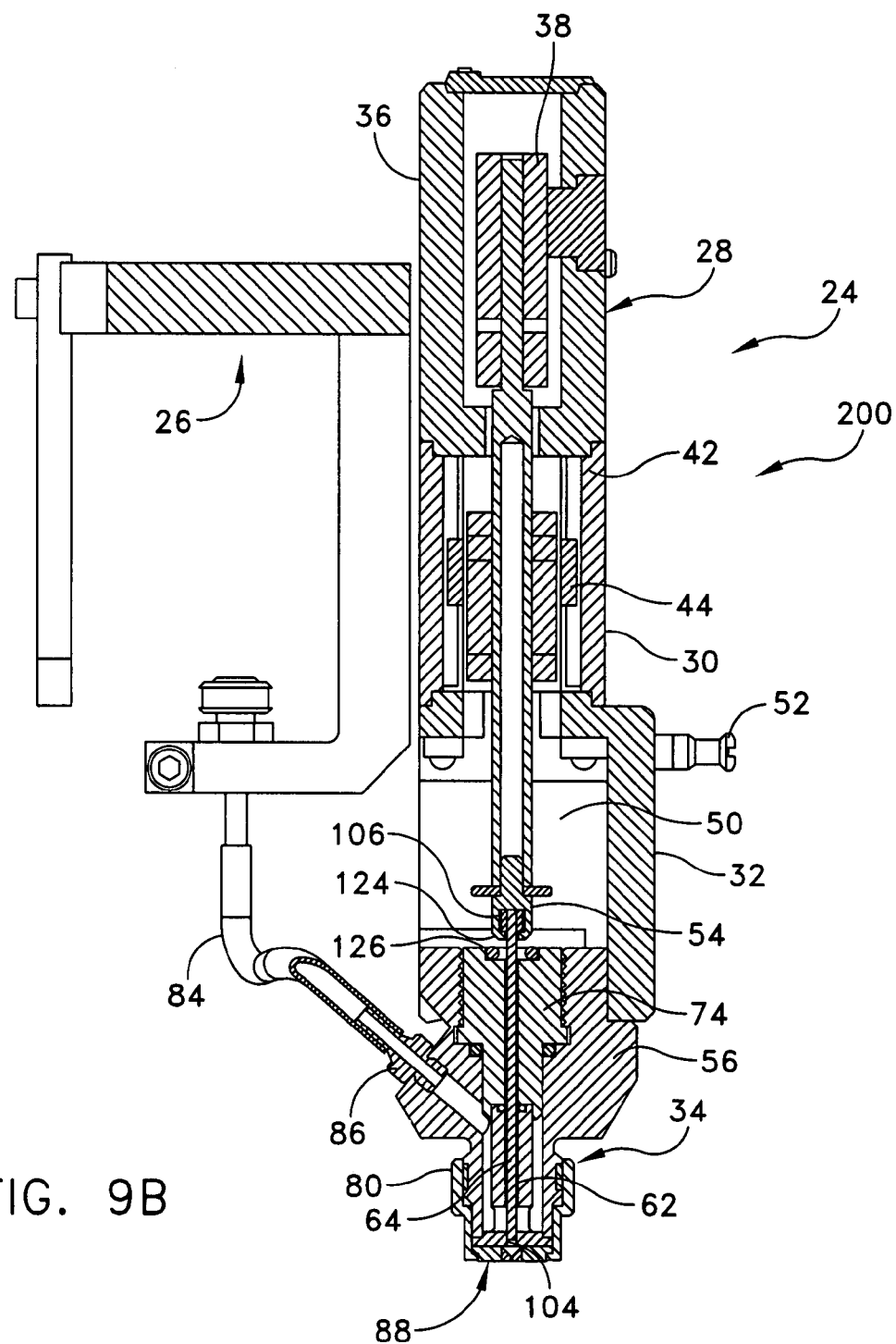
Figure 9C:
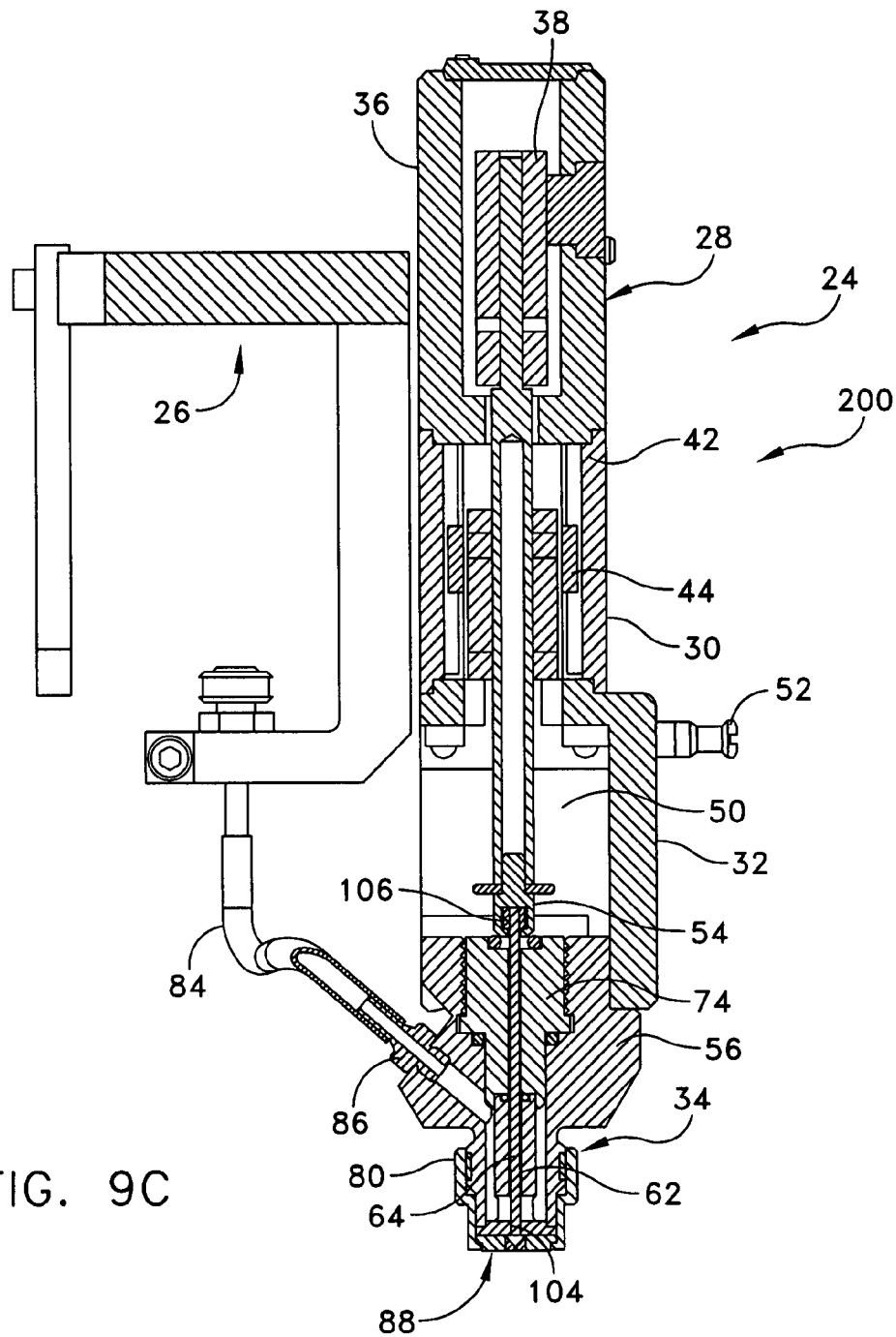

In FIG. 9A, the piston 64 is illustrated in a pre-dispense, retracted position. This position may be referred to as a "home" position. The motor assembly 30 drives the downward movement of the piston 64. FIG. 9B illustrates the piston 64 in a park position in which the piston is positioned within the dispensing bore 104 to block the delivery of viscous material into the dispensing bore. As shown, the piston 64 is positioned approximately two-thirds the way through the dispensing bore 104; however, the piston may be positioned at any location along the length of the dispensing bore. FIG. 9C illustrates the continued downward movement of the piston 64 to the aforementioned dispense position. Once in the dispense position, the volume of viscous material dispensed from the dispensing bore 104 is substantially equal to the volume of the piston entering the dispensing bore.

Figure 9D:
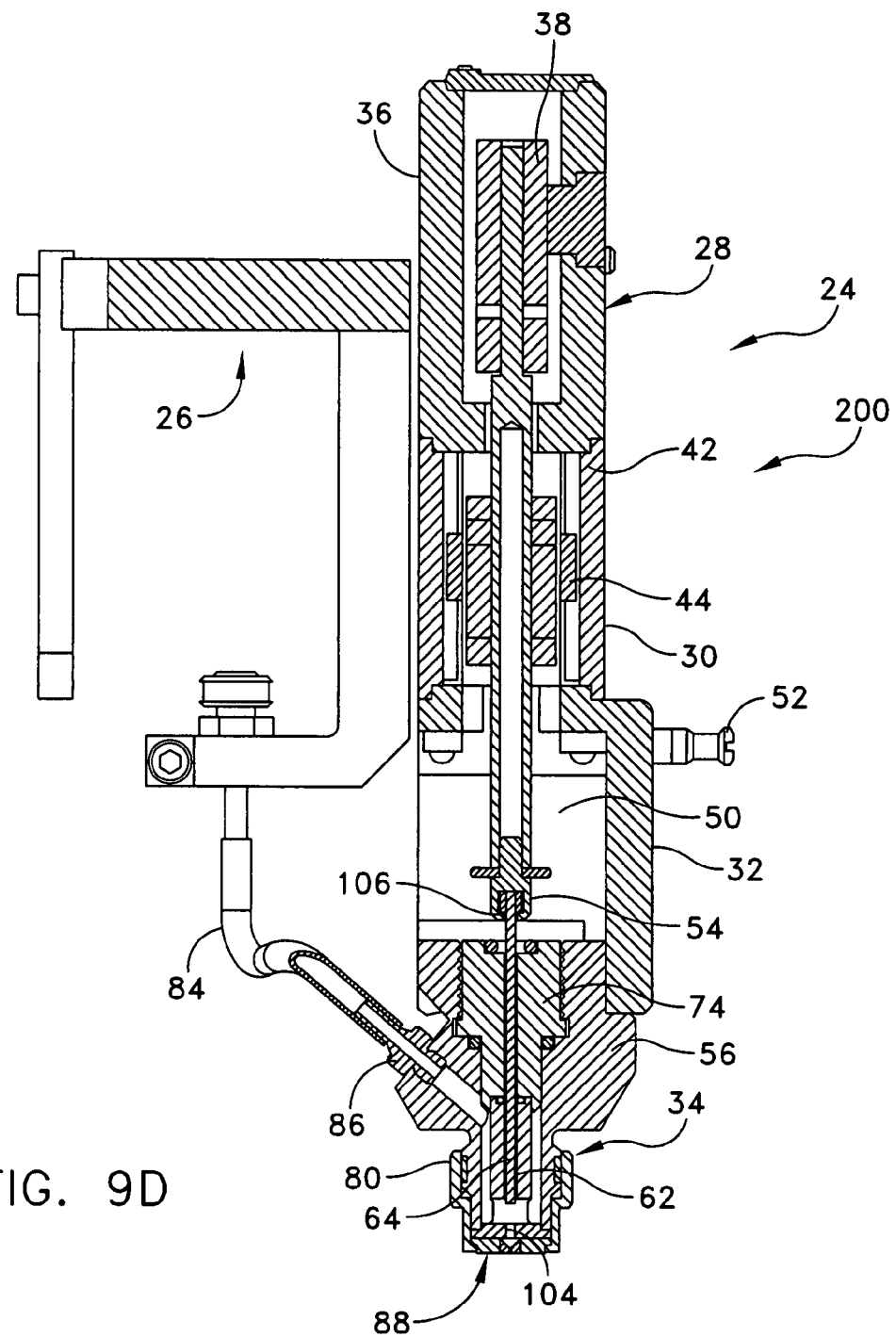
Figure 9E:
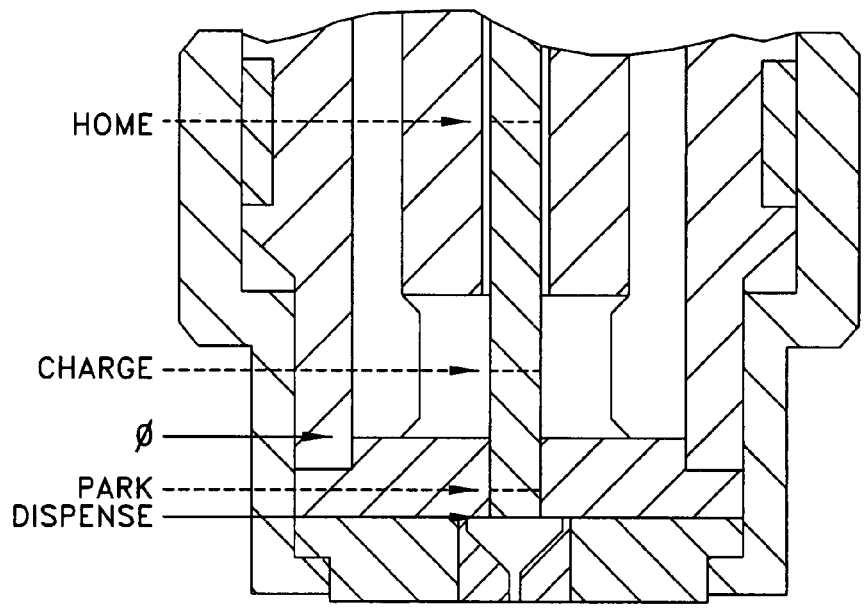
FIG. 9E is a cross-sectional view of a nozzle of the dispenser unit showing various positions of a piston of the dispenser unit.

Next, as illustrated in FIG. 9D, the motor assembly 30 drives the upward movement of the piston 64 to a charge position in which the piston clears or at least partially clears the slits 122 to allow viscous material to enter the dispensing bore 104. During operation, the piston 64 moves between the charge and dispense positions. When idle, the piston 64 may be moved to the park position to prevent material from being inadvertently dispensed. When not in use, the piston 64 may be moved via the motor assembly 30 back to the pre-dispense or home position illustrated in FIG. 9A.

Figure 9F:
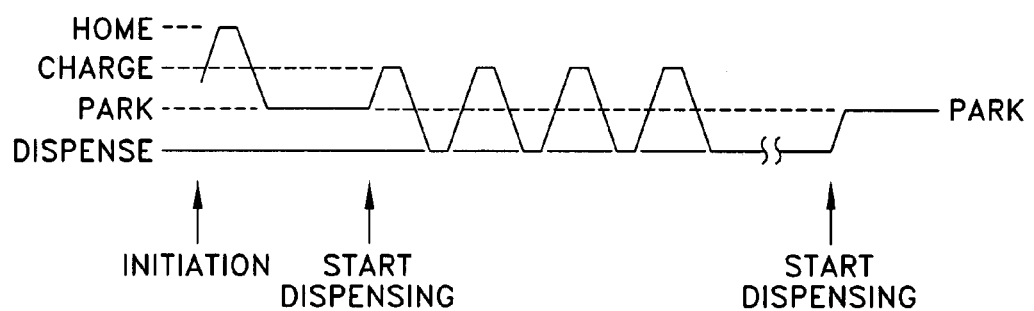
FIG. 9F is a diagram showing the position of the piston during an example operation of the dispenser unit.

In one embodiment, the movement of the piston is shown in FIG. 9F. As shown, the piston moves from a home position to a park position during an initiation process of the dispenser. During operation, the piston operates between the charge and dispense positions from the start of a particular dispense operation to the stop of the dispense operation. In the charge position, material flows into the dispensing bore from the chamber. The piston blocks the flow of material into the dispensing bore when the piston enters the dispensing bore. This is sometimes referred to as the "zero" position. The amount of material dispensed by the dispenser is substantially equal to volume of the piston that enters the dispensing bore. As shown in FIG. 9F, when stopped, the piston moves to the park position.

Figure 10:
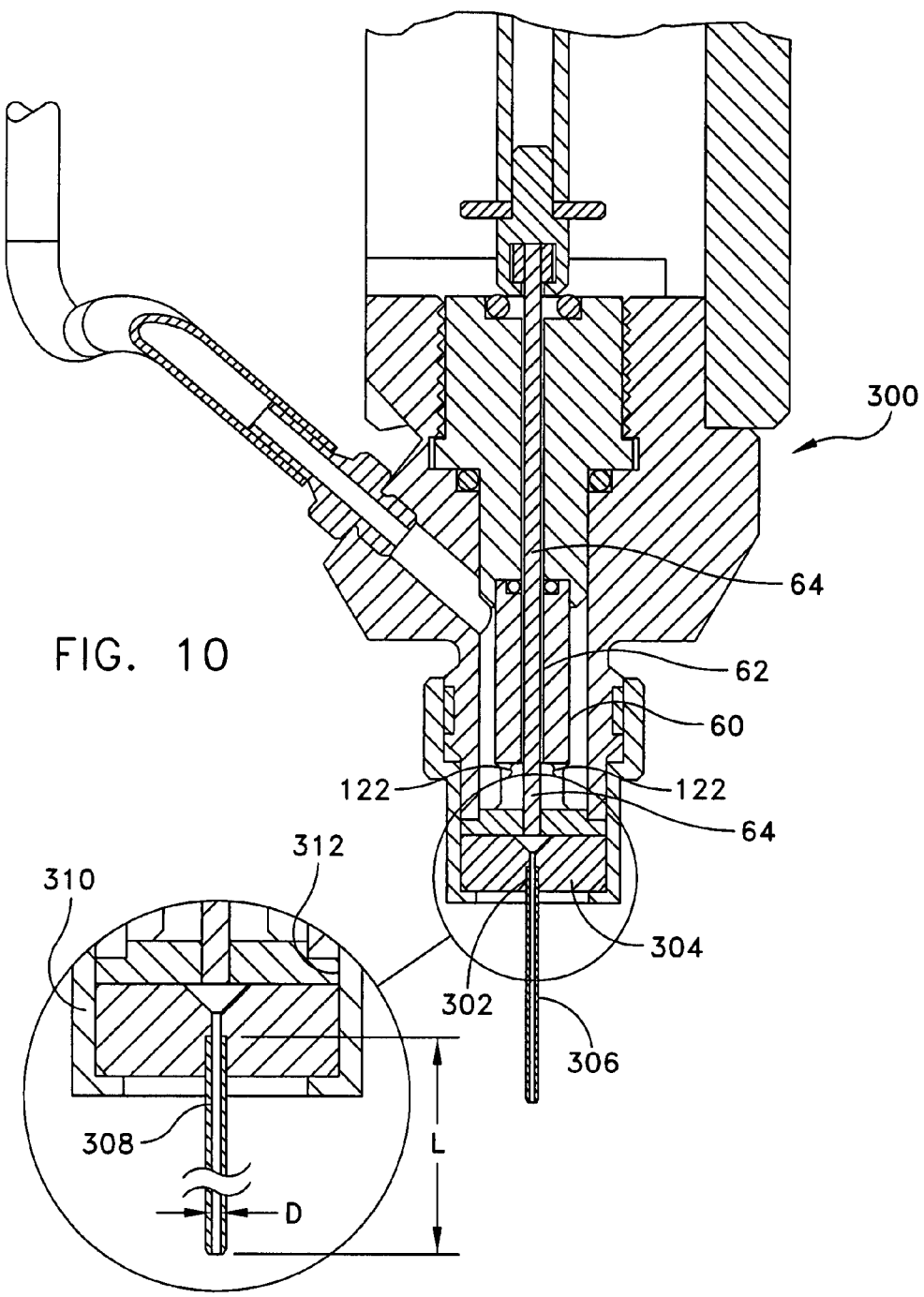
FIG. 10 is an enlarged cross-sectional view of a dispenser unit of another embodiment of the invention.

Turning now to FIG. 10, a dispenser unit, generally indicated at 300, of another embodiment is shown. The dispenser unit 300 is substantially identical to dispenser unit 14. Thus, corresponding parts are designated with corresponding reference numbers in FIG. 10. The nozzle assembly 34 includes a nozzle 302 having a head portion 304 and a needle portion 306 extending downwardly from the head portion. The needle portion 306 includes a needle bore 308 having an inner diameter D and a length L substantially greater than the inner diameter. In certain embodiments, the head portion 304 has a diameter of approximately 0.360 inches and a thickness of approximately 0.134 inches. The inner diameter D of the needle bore 308 is approximately between 0.010 to 0.033 inches. The length L of the needle bore 308 is between 0.25 and 0.591 inches. Thus, in certain embodiments, the ratio of the length L to the inner diameter D may range from approximately 7.5:1 to approximately 60:1. In certain embodiments, a dimple or funnel feature may be included on a top surface of the head portion 304 to direct viscous material into the dispensing bore 308 of the nozzle 302.

As shown, the dispensing bore 104, which is in fluid communication with the needle bore 308, is configured to receive the piston 62 therein to dispense material on the substrate. The needle nut 80 is configured to capture the head portion 304 of the nozzle 302 to secure the nozzle to the nozzle housing 56. Specifically, the needle nut 80 has a cup portion 310 configured to receive the head portion 304 of the nozzle 302 therein and an inner threaded surface 312 configured to mate with threads (not designated) provided on the nozzle housing 56.

In operation, the dispenser unit (e.g., dispenser unit 14) is positioned at a nominal clearance height above the substrate, e.g., circuit board 12. This clearance height is maintained at a relatively consistent elevation above the circuit board throughout the dispense operation, although variations in the height of the circuit board, or irregularities in the flatness of the top surface of the circuit board, may cause the clearance height to vary without adversely impacting the dispensing of viscous material. Specifically, the dispenser unit does not need to lift the nozzle away from the circuit board in the z-axis direction at the end of each dispense operation. However, to accommodate variations in the height of the circuit board and irregularities in the flatness of the circuit board (or to even avoid obstacles), the dispenser may be configured to achieve z-axis movement.

In one embodiment of the invention, to achieve the object of maintaining the height of the nozzle of the dispenser unit at a desired elevation above the circuit board, there is provided a system for measuring the height of the dispenser nozzle above the circuit board in the z-axis direction. In some height (or distance) measuring systems, physical contact is made between the measuring system and the surface (e.g., a surface of a substrate embodying a printed circuit board) to be measured. One such height measuring system is described in U.S. Pat. No. 6,093,251, entitled APPARATUS FOR MEASURING THE HEIGHT OF A SUBSTRATE IN A DISPENSING SYSTEM, which is assigned to the assignee of the invention, and is incorporated herein by reference. Specifically, U.S. Pat. No. 6,093,251 discloses a measuring probe that is extendable between a reference point and a location on the circuit board to measure the height of the substrate.

In other height measuring systems, a laser light source and an optical sensing system are combined to measure the position of an object without making physical contact. An example of a non-contact measuring system is manufactured and distributed by Micro-Epsilon Messtechnik GmbH of Ortenburg, Germany. The optical sensing system can replace the measuring probe. In other embodiments of the invention, the height measuring system can be incorporated to facilitate the measurement of and compensation for variations in the vertical position of the top surface of the circuit board.

Using height measuring systems described above, dispensers of the invention may be capable of measuring the distance or height of the tip of the nozzle above the top surface of the circuit board. Maintaining the height of the nozzle above the substrate is one factor to control in an effort to optimize the operation of the dispenser. Specifically, the height of the nozzle above the circuit board should be sufficient to ensure the dispensing of material out of the nozzle without risk of the nozzle touching the circuit board. Also, the height of the nozzle, if too high above the circuit board, may cause the material to splash on the circuit board and cause undesirable satellites.

Once the height of the nozzle above the top surface of the circuit board is determined and corrected, if required, the dispenser unit may be engaged to dispense viscous material. A predetermined dispense operation may be programmed into the controller of the dispenser, which may form a part of a line of equipment used to surface mount components onto a printed circuit board. Specifically, an area of the top surface of the circuit board requiring viscous material is preprogrammed into the controller. The rate at which material is dispensed by the dispenser is controlled by manipulating the operation of the motor and the speed at which the nozzle is moved over the circuit board. The speed at which the motor operates and the viscosity of the material being dispensed are factors used to determine an optimal desired volumetric flow rate, i.e., the rate at which the motor operates. Given the dispensing of material and the lack of z-axis directional movement of the nozzle over the circuit board, the material is capable of being dispensed quickly and efficiently to cover the predetermined area.

During dispensing, the dispensing of material is initiated, and lateral motion (i.e., x-axis and y-axis) of the dispenser is commenced. The flow rate of material should be sufficient to overcome the surface tension of the material within the nozzle. Once the area is covered with the desired amount of material, the dispensing operation is terminated. The dispenser ejects material from the nozzle with sufficient inertia so that when the dispenser ceases the flow of material, the material breaks free from the nozzle. As described above, by varying the volumetric flow rate at which the material is dispensed by manipulating the speed of operation of the motor of the dispenser, the velocity of the material as it exits the needle and thus the velocity at which it impacts the circuit board can be controlled by the controller. If too low a volumetric flow rate is used, the exit velocity, and therefore the exit inertia, is insufficient to enable the material to clearly detach from the nozzle. If too high a volumetric flow rate is used, then the material impacts the circuit board at too high a velocity which may cause undesirable splashing of material and satellites. Furthermore, by varying the speed at which the dispensing material is moved over the circuit board in the x-axis and the y-axis directions, the effective diameter of the dot of material is additionally controlled.

The stage of measuring the amount of viscous material dispensed can be achieved by monitoring the volumetric flow rate of material dispensed during a dispensing operation. In accordance with one embodiment of the invention, the measurement is achieved by measuring the size of the deposited material. Specifically, the height and diameter of material dispensed onto the circuit board is measured by use of an off-axis imaging system. Such a system is disclosed in U.S. patent application Ser. No. 10/831,468, entitled IMAGING AND INSPECTION SYSTEM FOR A DISPENSER AND METHOD FOR SAME, which is assigned to the assignee of the invention and incorporated herein by reference. The vision system may be positionable to obtain images of the top surface of the circuit board along an optical axis to capture the image. Specifically, the system determines the characteristics of the dispensed material (e.g., the dispensed material's height and diameter). The characteristics of the dispensed material are compared with acceptable limits programmed into the controller and a determination is made as to whether the circuit board passes inspection or must be re-worked. The information derived from such an imaging system is then used to adjust certain parameters of the dispensing process to more accurately achieve a desired result.

Once measured, the measured amount can be compared to a calculated amount of material dispensed to determine the accuracy of the dispensing operation. Specifically, the volumetric flow rate of the material being dispensed through the dispensing nozzle can be calculated to establish a calculated amount. A flow meter may also be employed to calculate the amount of material being dispensed through the nozzle. The stage of capturing an image to establish a measured amount, although not required, helps improve the accuracy of the dispensing operation since any differential between the measured amount and the calculated amount can be corrected by the controller.

Figure 11:
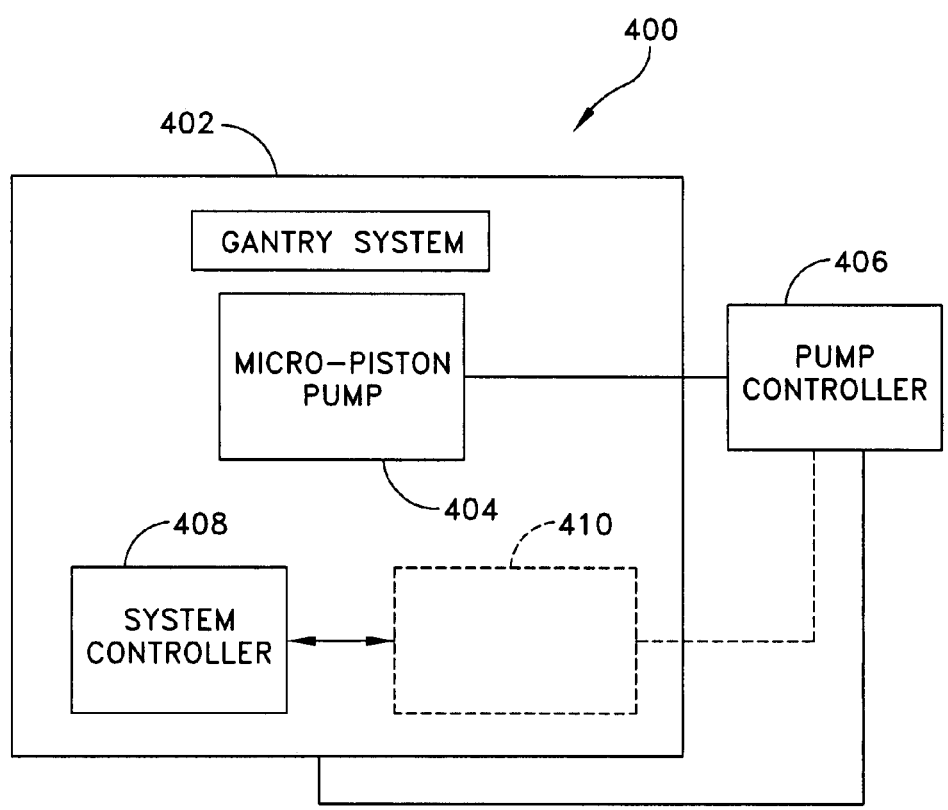
FIG. 11 is a functional block diagram of a dispenser of embodiments of the invention.

Referring to FIG. 11, in a certain embodiment, the dispenser may be based on an existing platform, such as a platform dispensing system that is offered under the brand name XyflexPro+, and operates using dispensing software, such as software that is offered under the brand name Benchmark, both of which are offered by Speedline Technologies, Inc. of Franklin, Mass., the assignee of the invention.

As indicated in FIG. 11, the primary components of the system, generally indicated at 400, may include the dispensing platform 402, the micro-piston pump or dispenser unit 404, a pump controller 406, and a system controller 408. The dispenser system 400 may provide an interface designated by dashed lines at 410 that allows the dispensing platform 402 to operate with a number of different pumps and/or valves using a standard interface. The digital interface 410 provides signals to trigger dispensing from the micro-piston pump 404.

In one embodiment, the interface 410 may be a standard real-time digital interface. In another embodiment, the dispenser system 400 may also include a generic interface option. The generic interface provides a standard interface that includes the real time digital interface, as well as an optional standard RS-232 interface. The system controller 408, through a 3rd party API and database object, provides standard commands to provide set-up parameters for different valves and pumps and receives status monitoring information from the valves and pumps. In other versions, an Ethernet connection may be provided between the system controller 408 and the pump controller 406.

The pump controller 406 may be selected from a commercially available motion and I/O controller selected from any number of commercially available controllers, for example, a controller offered by Galil (DMC-4010) of Rocklin, Calif. The pump controller 406 may be packaged with a PWM amplifier and power supply and may be housed within a metal enclosure. Alternatively, a DMC-4020 controller may operate two micro-piston pump units. A power switch (not shown) may permit the pump controller 406 to be turned on and off independent from the dispensing platform 402.

As discussed above, dispensing platform 402 may include a conveyor system, an x-y gantry system, a weigh scale calibration system and a nozzle cleaning station. The conveyor system may be used to shuttle substrates, such as circuit boards, to a dispensing position in the system. The x-y gantry system may include a mounting plate to which the micro-piston pump 404 is coupled. The x-y gantry system may be used to position the micro-piston pump 404 to dispensing positions over a substrate. The x-y gantry system also may include the capability to raise and lower (z-axis movement) the pump 404 to vary or control the dispensing height above the substrate.

The operation of the micro-piston pump unit 404 may be controlled through a user interface coupled to the system controller 408. A user, through the interface, controls parameters of the micro-piston pump unit 404 including the retracted height of the piston and the dwell time of the piston. Using different parameter settings, the pump 404 can be operated in a number of different modes to dispense materials over a wide range of viscosity and volume of material dispensed.

In the dispenser, pressurized air may be applied to the source of material of the pump by the dispensing platform 402. The pressurized air may be used to force material from the material source into the pump 404. The particular pressure provided may be selected and manually adjusted based on the material being used, volume of material being dispensed, and mode of operation of the valve. In typical applications, the pressure applied to the material is expected to be on the order of 4-20 psi.

As discussed above, an optional nozzle heater may be used with the micro-piston pump 404, and a temperature of the nozzle heater may be set by the user. The nozzle heater may be configured to surround the lower portion of the pump. In one configuration, the nozzle heater may include a cartridge heater and a temperature sensor. The nozzle heater may be controlled by the system to maintain the temperature sensor at a set temperature.

In one embodiment, the nozzle heater may be constructed to be attached to the lower portion of the dispenser unit to provide heat to the nozzle of the unit. The nozzle heater may include a connecting cable, a body, a connector mounting block, a connector, mounting hardware, a cartridge heater, and a temperature sensor. The body may be configured to have a conical lower opening through which the nozzle extends. Clamps may be provided to secure the nozzle heater to the pump by compressing the housing against the nozzle nut. Pins may be used to align the heater to the pump. The cartridge heater and the temperature sensor may be coupled to the system controller 408, which maintains the temperature in the vicinity of the temperature sensor to a set value.

During operation of the dispenser, a user, through a user interface for the dispensing platform 402, defines dispensing areas on a circuit board. In some embodiments of the dispenser, the pump 404 may be used only to dispense lines of material formed through multiple dispensing cycles of the pump; however, in other embodiments, material may be dispensed at selected locations on a circuit board or other substrate using an individual dispensing cycle or multiple dispensing cycles. For lines of material, a user defines the start and stop positions of a line, and the dispensing platform is able to move the pump to place material along the line.

Once all dispensing areas on a circuit board are defined and the dispensing parameters are set, the dispenser is able to receive circuit boards for processing. After moving a circuit board to a dispensing location, the dispenser controls the gantry system to position the micro-piston pump 404 over a dispensing location. The dispensing location may be a particular point or the start of a line. The system controller 408 of the dispenser system 400 then sends a "start" control signal over the real-time control line instructing the micro-piston pump to start dispensing. If a line of material is to be dispensed, the dispenser system 400 will start moving after issuing the "start" control signal. Once the pump 404 receives the "start" signal, the pump starts dispensing using the parameters (including cycle rate) previously set. The pump 404 continues dispensing until a "stop" or command is received from the system controller 408. The cycle rate and time duration between the "start" signal and the "stop" signal will determine how many times the pump 404 dispenses material along a given line or at a particular location.

Dispensing for a particular board will continue until material has been dispensed at all locations on the board. The board is then unloaded from the system and a new board can be loaded into the system.

Thus, it should be observed that dispensers of at least one embodiment of the invention are capable of accurately dispensing viscous material. The dispenser of embodiments of the invention is capable of having the nozzle assembly quickly and easily replaced to vary the size of material dispensed on the substrate. Also, given the configuration of the piston and the dispensing bore, the preciseness of the volume of material deposited on the substrate is further enhanced.

The dispenser unit disclosed herein may be employed on any suitable dispenser. For example, a dispenser unit having a different material supply configuration or movement configuration may be employed. In addition, various additional components may be added to the dispenser. For example, the dispenser may include a needle cleaner, such as the needle cleaner disclosed in U.S. Pat. No. 6,775,879, entitled NEEDLE CLEANING SYSTEM, which is owned by Speedline Technologies, Inc., the assignee of the invention. Additionally, the dispenser may include a weigh scale, such as the weigh scale disclosed in U.S. Pat. No. 6,814,810, entitled APPARATUS FOR CALIBRATING A DISPENSING SYSTEM, which is also owned by Speedline Technologies, Inc.

Having thus described at least one embodiment of the invention, various alternations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and equivalents thereto.

What is claimed is:

1. A dispenser for dispensing a volume of viscous material on a substrate, the dispenser comprising:
 a frame;
 a gantry system coupled to the frame;
 a viscous material supply coupled to the frame;
 a dispenser unit coupled to the gantry system, the dispenser unit comprising
  a housing having a chamber,
  a piston disposed in the chamber,
  a motor coupled to the piston to drive the movement of the piston within the chamber,
  a dispensing bore configured to receive the piston therein and in fluid communication with the viscous material supply, and
  a nozzle coupled to the housing, the nozzle having an orifice co-axial with the dispensing bore; and
 a controller coupled to the motor to control the operation of the motor,
 wherein the controller is configured to move the piston from a pre-dispense position in which viscous material is introduced into the dispensing bore to a dispense position in which the piston enters the dispensing bore to positively displace viscous material within the dispensing bore as the piston moves within the dispensing bore, and wherein the piston and the dispensing bore are configured such that a volume of viscous material dispensed from the dispensing bore is substantially equal to the volume of the piston entering the dispensing bore when moving the piston from the pre-dispense position to the dispense position, and wherein the orifice has a small-diameter bore in fluid communication with the dispensing bore, the small-diameter bore being smaller in diameter than the dispensing bore.

2. The dispenser of claim 1, wherein the housing further includes a surface formed therein, and wherein the motor includes a connector coupled to the piston, the connector including a surface configured to engage the surface of the housing to limit the movement of the piston to the dispense position.

3. The dispenser of claim 2, wherein the surface of the housing includes compliant material.

4. The dispenser of claim 2, wherein the connector is removably coupled to the piston.

5. The dispenser of claim 1, wherein the housing comprises a barrel disposed within the chamber, the barrel having an inner diameter sized to slidably receive the piston therein.

6. The dispenser of claim 5, wherein the dispensing bore is integrally formed with the barrel.

7. The dispenser of claim 5, wherein the barrel and the piston are configured to be selectively interchangeable to change a diameter of the dispensing bore.

8. The dispenser of claim 1, wherein the motor comprises a linear voice coil motor.

9. The dispenser of claim 1, wherein the dispenser unit further comprises an opening formed in the housing to deliver viscous material to the dispensing bore.

10. The dispenser of claim 9, wherein the housing is configured such that the delivery of viscous material to the dispensing bore is blocked by the piston as the piston moves to the dispense position.

11. The dispenser of claim 9, wherein the piston has a flat end at an end adjacent the dispensing bore.

12. The dispenser of claim 1, wherein the nozzle comprises a head portion and a needle portion extending from the head portion, the needle portion having a needle bore that is co-axial with the dispensing bore.

13. The dispenser of claim 12, further comprising a retainer configured to capture the head portion of the nozzle to removably secure the nozzle to the housing.

14. A dispenser for dispensing a viscous material on a substrate, the dispenser comprising:
a frame;
a gantry system coupled to the frame;
a dispenser unit coupled to the gantry system, the dispenser unit comprising
a housing having a chamber,
a barrel disposed within the chamber, the barrel having a dispensing bore formed therein,
a piston disposed in the dispensing bore of the barrel, the piston being configured to move between a pre-dispense position in which viscous material is introduced into the dispensing bore and a dispense position in which the piston positively displaces viscous material within the dispensing bore,
wherein the barrel and the piston are configured to be selectively interchangeable to change a diameter of the dispensing bore,
a nozzle coupled to the housing, the nozzle having an orifice co-axial with the dispensing bore, and
a motor coupled to the piston to drive the movement of the piston within the barrel; and
a controller coupled to the motor to control the operation of the motor,
wherein the controller is configured to move the piston from a pre-dispense position in which viscous material is introduced into the dispensing bore to a dispense position in which the piston enters the dispensing bore to positively displace viscous material within the dispensing bore as the piston moves within the dispensing bore, and wherein the piston and the dispensing bore are configured such that a volume of viscous material dispensed from the dispensing bore is substantially equal to the volume of the piston entering the dispensing bore when moving the piston from the pre-dispense position to the dispense position, and wherein the orifice has a small-diameter bore in fluid communication with the dispensing bore, the small-diameter bore being smaller in diameter than the dispensing bore.

15. The dispenser of claim 14, wherein the housing further includes a surface formed therein, and wherein the motor includes a connector coupled to the piston, the connector including a surface configured to engage the surface of the housing to limit the movement of the piston to the dispense position.

16. The dispenser of claim 14, wherein the barrel has an inner diameter sized to slidably receive the piston therein.

17. The dispenser of claim 14, wherein the dispensing bore is integrally formed with the barrel.

18. The dispenser of claim 14, wherein the dispenser unit further comprises a viscous material supply container configured to deliver viscous material to the dispensing bore via an opening formed in the housing.

19. The dispenser of claim 18, wherein the dispenser is constructed such that delivery of viscous material to the dispensing bore is blocked by the piston as the piston moves to the dispense position.

20. The dispenser of claim 18, wherein the piston has a flat end at an end adjacent the dispensing bore.

21. A dispenser for dispensing a viscous material on a substrate, the dispenser comprising:
a frame;
a gantry system coupled to the frame;
a viscous material supply coupled to the frame;
a dispenser unit coupled to the gantry system, the dispenser unit comprising
a housing having a chamber,
an opening formed in the housing to deliver viscous material from the viscous material supply to the chamber,
a piston disposed in the chamber,
a motor coupled to the piston to drive the movement of the piston between the retracted and extended positions within the chamber,
a dispensing bore configured to receive the piston therein and in fluid communication with the chamber, and
a nozzle coupled to the housing, the nozzle having an orifice co-axial with the dispensing bore; and
a controller coupled to the motor to control the operation of the motor,
wherein the controller is configured to move the piston from the charge position in which viscous material may be delivered to the chamber via the opening, to the dispense position in which the piston is moved toward the dispensing bore of the nozzle to block the delivery of viscous material into the dispensing bore and enters the dispensing bore to positively displace viscous material within the dispensing bore, and wherein the piston and the dispensing bore are configured such that a volume of viscous material dispensed from the dispensing bore is substantially equal to the volume of the piston entering the dispensing bore when moving the piston from the charge position to the dispense position, and wherein the orifice has a small-diameter bore in fluid communication with the dispensing bore, the small-diameter bore being smaller in diameter than the dispensing bore.

22. The dispenser of claim 21, wherein the housing further includes a surface formed therein, and wherein the motor includes a connector coupled to the piston, the connector including a surface configured to engage the surface of the housing to limit the movement of the piston to the dispense position.

23. The dispenser of claim 21, wherein the housing comprises a barrel disposed within the chamber, the barrel having an inner diameter sized to slidably receive the piston therein.

24. The dispenser of claim 21, wherein the motor comprises a linear voice coil motor.

25. A dispenser for dispensing a volume of viscous material on a substrate, the dispenser comprising:
   a frame;
   a gantry system coupled to the frame;
   a viscous material supply coupled to the frame;
   a dispenser unit coupled to the gantry system, the dispenser unit comprising
      a housing having a chamber,
      a piston disposed in the chamber,
      a motor coupled to the piston to drive the movement of the piston within the chamber,
      a dispensing bore configured to receive the piston therein and in fluid communication with the viscous material supply,
      a nozzle coupled to the housing to dispense material on the substrate, the nozzle including a head portion and a needle portion extending from the head portion, the needle portion including a needle bore having an inner diameter and a length substantially greater than the inner diameter, the needle bore being co-axial with the dispensing bore, and
      a retainer configured to capture the head portion of the nozzle to removably secure the nozzle to the housing; and
   a controller coupled to the motor to control the operation of the motor to perform a dispense operation of viscous material on the substrate,
   wherein the controller is configured to move the piston from a pre-dispense position in which the viscous material is introduced into the dispensing bore to a dispense position in which the piston enters the dispensing bore to positively displace viscous material within the dispensing bore as the piston moves within the dispensing bore, and wherein the piston and the dispensing bore are configured such that a volume of viscous material dispensed from the dispensing bore is substantially equal to the volume of the piston entering the dispensing bore when moving the piston from the pre-dispense position to the dispense position,
   wherein the orifice has a small-diameter bore in fluid communication with the dispensing bore, the small-diameter bore being smaller in diameter than the dispensing bore.

26. The dispenser of claim 25, wherein the retainer has a cup portion configured to receive the head portion of the nozzle therein and a threaded surface configured to mate with threads provided on the housing.

\* \* \* \* \*